United States Patent
Muraki

(10) Patent No.: US 7,621,732 B2
(45) Date of Patent: Nov. 24, 2009

(54) MOLDING APPARATUS FOR MANUFACTURING SEMICONDUCTOR DEVICE

(75) Inventor: Shinji Muraki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/785,154

(22) Filed: Apr. 16, 2007

(65) Prior Publication Data

US 2007/0275507 A1 Nov. 29, 2007

(30) Foreign Application Priority Data

May 23, 2006 (JP) ............... 2006-142991

(51) Int. Cl.
*H01L 21/56* (2006.01)
(52) U.S. Cl. ............... 425/125; 425/89; 425/127
(58) Field of Classification Search ............... 425/89, 425/116, 117, 125, 127
See application file for complete search history.

(56) References Cited

U.S. PATENT DOCUMENTS

| | | | | |
|---|---|---|---|---|
| 3,514,849 A * | 6/1970 | Landron, Jr. | ............... | 29/827 |
| 5,424,250 A * | 6/1995 | Sawada | ............... | 438/127 |
| 5,622,873 A * | 4/1997 | Kim et al. | ............... | 438/116 |
| 5,644,169 A * | 7/1997 | Chun | ............... | 257/787 |
| 5,897,338 A * | 4/1999 | Kaldenberg | ............... | 438/116 |
| 6,489,178 B2 * | 12/2002 | Coyle et al. | ............... | 264/272.17 |
| 6,558,600 B1 * | 5/2003 | Williams et al. | ............... | 264/272.17 |
| 6,563,207 B2 * | 5/2003 | Shinma | ............... | 425/127 |
| 2004/0104478 A1* | 6/2004 | Noguchi | ............... | 257/738 |
| 2005/0026418 A1* | 2/2005 | Egawa et al. | ............... | 438/614 |
| 2005/0054144 A1* | 3/2005 | Raben | ............... | 438/127 |

FOREIGN PATENT DOCUMENTS

JP  2001-185568  7/2001

* cited by examiner

*Primary Examiner*—Robert B Davis
(74) *Attorney, Agent, or Firm*—Rabin & Berdo, PC

(57) ABSTRACT

A molding apparatus including an upper half having a substrate mounting plate; and a lower half coupled with the upper half to form a cavity there between, wherein the substrate mounting plate faces the cavity, wherein the lower half includes a projecting part which has a top surface which faces the cavity and which projects from the bottom surface of the lower half toward a substantial center point of the substrate mounting plate, wherein the substrate mounting plate is adjustably mounted on the upper half and movable toward the lower half, and wherein the upper half includes a clamp mounted thereon which surrounds the projecting part when the upper and lower halves are coupled with each other.

4 Claims, 11 Drawing Sheets

MOLDING APPARATUS FOR MANUFACTURING SEMICONDUCTOR DEVICE

BACKGROUND OF THE INVENTION

1. Field of the Invention

The present invention relates to a molding apparatus for manufacturing a semiconductor device, and in particular, relates to a molding apparatus for encapsulating a semiconductor device having a W-CSP (Wafer-level Chip Size Package) structure and a method using the same.

2. Description of the Related Art

A semiconductor package having approximately the same size as a semiconductor chip diced from a semiconductor wafer is typically referred to as a CSP (Chip Size Package). A CSP in which semiconductor chips formed in a semiconductor wafer is packaged at the wafer level is referred to as a "W-CSP".

In a method of manufacturing a semiconductor device by W-CSP processing, a resin-encapsulation step in which a mold is used has been known.

A method of manufacturing a semiconductor device is described in, for example, "Japanese Patent Kokai No. 2001-185568" (a document D1). While using a detachable metal mold having a first metal mold part and a second metal mold part, the semiconductor device is manufactured by resin-encapsulation of a substrate formed with semiconductor elements. The resin encapsulation of the semiconductor device is performed by applying a uniform molding pressure to the substrate.

In particular, the method of manufacturing the semiconductor device disclosed in the document D1 has the following steps.

The method includes a substrate mounting step in which the substrate is mounted on the first metal mold part, a resin mounting step in which an encapsulation resin material for encapsulating is applied to the substrate, and a resin layer forming step in which the substrate is encapsulated with the encapsulation resin material. In the resin layer forming step, a resin layer is formed by compressing the resin material between the first metal mold part and the second metal mold part so that the encapsulation resin material extends over a large area of the substrate by applying a molding pressure on the encapsulation resin material.

In the method for manufacturing the semiconductor device having the W-CSP structure while using the detachable metal mold, the encapsulation resin material is mounted on applied to a semiconductor wafer which is mounted on the second metal mold part. Therefore, there is a probability that columnar electrodes formed on the semiconductor wafer are probably deformed by the encapsulation resin material on which the molding pressure is applied.

Moreover, there is the following problem in the method. Air in a cavity of the detachable metal mold is not easily evacuated, so that air voids are prone to be generated in the encapsulation resin material of the semiconductor device. The generation of the air voids will decrease the yield rate of the semiconductor device.

SUMMARY OF THE INVENTION

An object of the present invention is to provide a molding apparatus for encapsulating a semiconductor device having a W-CSP structure and a method of manufacturing the semiconductor device using the same, which method can prevent deformation of columnar electrodes of the semiconductor device and also can prevent air voids generated in a resin-encapsulated part by simple processes.

According to a first aspect of the present invention, there is a provided a molding apparatus comprising an upper half having a substrate mounting plate and a lower half coupled with the upper half to form a cavity therebetween. The substrate mounting plate faces to the cavity, and the lower half includes a projecting part which faces to the cavity and projects to the substantial center of point of the substrate mounting plate.

According to a second aspect of the present invention, there is a provided a method of manufacturing a semiconductor device includes the following steps.

(1) A molding apparatus comprising an upper half having a substrate mounting plate and a lower half coupled with the upper half to form a cavity therebetween is prepared. The substrate mounting plate faces to the cavity, and the lower half includes a projecting part which faces to the cavity and projects to the substantial center of point of the substrate mounting plate.

(2) A semiconductor substrate is fixed on the substrate mounting plate of the upper half. The semiconductor substrate includes a chip formation region and a circumferential region which surrounds the ship formation region. The semiconductor substrate further includes a first principal surface on which interconnection layers formed in the chip formation region and columnar electrodes connected to the interconnection layers are formed and a second principal surface which is reverse to the first principal surface.

(3) A release film is attached so as to cover a surface of the lower half facing to the cavity.

(4) The upper half and the lower half are heated.

(5) An encapsulating resin material is mounted on the release film.

(6) The semiconductor substrate is encapsulated with the resin encapsulating material by clamping either one of the lower half or the upper half on the other while forming a vacuum in the cavity after coupling the lower half and the upper half.

A semiconductor substrate mounted on an upper half of a molding apparatus is separated from an encapsulation resin material at the time of forming a vacuum in a cavity, so that the encapsulation resin material does not contact to the columnar electrodes. Thus, deformation of the columnar electrodes can be effectively prevented.

A molding apparatus of the present invention has an upper half and a lower half coupled with the upper half to form a cavity therebetween. The lower half includes a projecting part which faces to the cavity and projects to the substantial center of point of the substrate mounting plate. Thus, a melted encapsulation resin material is spread from the center of a semiconductor substrate to outer edge thereof. The melted encapsulation resin material can be uniformly spread over the semiconductor substrate while preventing generation of voids.

A molding apparatus of the present invention includes a lower half having a projecting part, thus a manufacturing processing can be simply performed. The present invention contributes to cost-reduction of manufacturing a semiconductor device.

DETAILED DESCRIPTION IF THE INVENTION

Figure 1A:
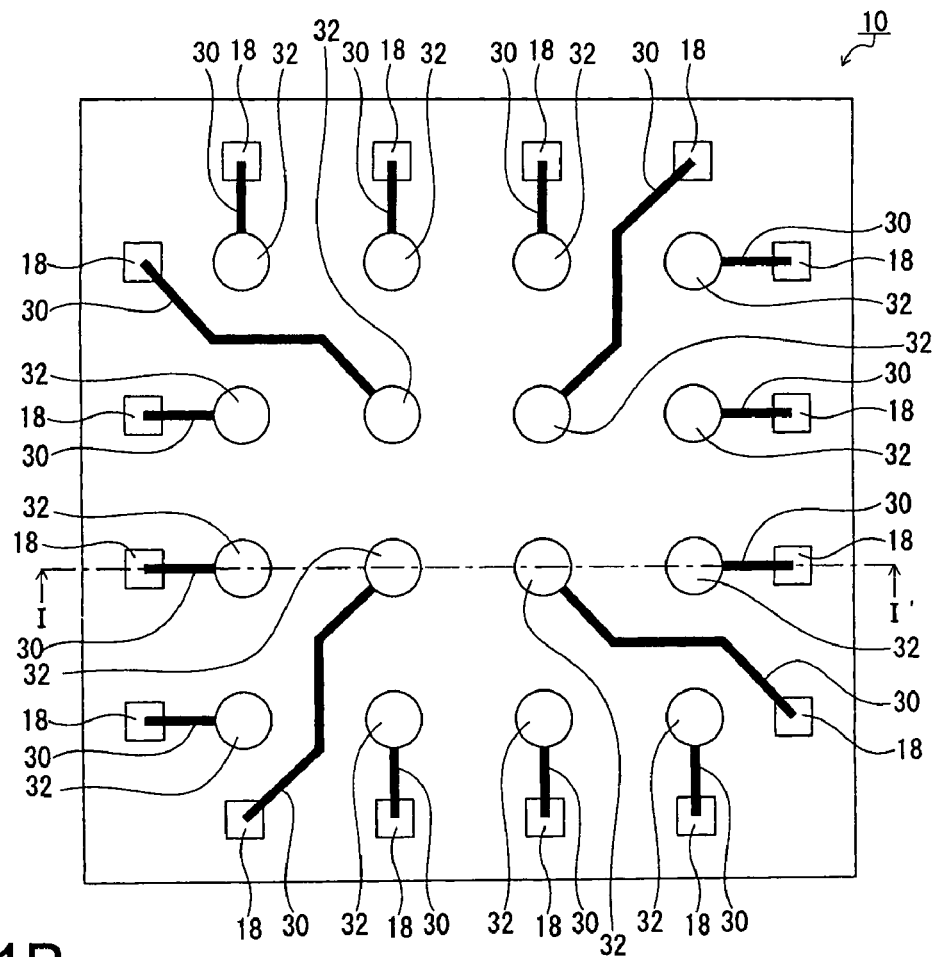
FIG. 1A illustrates a perspective top view of a semiconductor device of the present invention.

Embodiments of the present invention will now be described with reference to drawings. In the drawings, shapes of, sizes of, and arrangements of components are only schematically illustrated in extent to which the present invention can be easily understood. The present invention is not especially limited to the drawings.

Moreover, in the following description, specific materials, manufacturing conditions, and numerical conditions etc. are merely one of favorable examples. Therefore, the present invention is not defined by these conditions. In the drawings, similar components are denoted by the same reference numerals and are not further described in some instances.

CONFIGURATION EXAMPLE OF SEMICONDUCTOR DEVICE

First of all, a semiconductor device 10, which is a configuration example of semiconductor devices of the present invention, will now be described with reference to FIGS. 1A and 1B.

FIG. 1A is a perspective top view showing a semiconductor device 10 (hereinafter also called semiconductor chip) as viewed from the top of semiconductor device 10 for describing arrangement of components formed therein. An encapsulating part 34 formed on the semiconductor device 10 is omitted in FIG. 1A for easy identification of interconnection structures of the device. FIG. 1B is a cross-sectional view of the semiconductor device 10 taken along dash line I-I' of FIG. 1A. In FIG. 1B, the encapsulating part 34 is illustrated.

The semiconductor device 10 is manufactured by W-CSP processing. A circuit element configuration region for configuring predetermined circuit elements is formed in a semiconductor substrate 12 by a wafer processing. In FIGS. 1A and 1B, an element region 14 corresponds to the circuit element configuration region. In typical, a plurality of active devices, each of which has integrated circuits such as LSI, are formed in the element region 14. In the following description, a structural body, in which the element region 14 is formed in the semiconductor substrate 12, is hereinafter called a semiconductor body 13. With regard to the semiconductor body 13, a surface 14a of the element region 14 corresponds to a surface of the semiconductor body 13. The planar shape of the element region 14 is typically rectangular (square or rectangular).

Typically, multilayer interconnection structures (not shown) for interconnecting the active devices are formed in the element region 14 so that the active devices can be cooperated so as to perform predetermined functions.

A plurality of electrode pads 18 (hereinafter circuit element connection pads), which are connected to the circuit elements and the interconnection structures of the element region 14, are formed on the element region 14. A semiconductor substrate 11 (hereinafter a semiconductor wafer) is configured by a semiconductor body 13, the electrode pads 18, and interconnection structures 30.

As shown in FIG. 1A, the plurality of the circuit element connection pads 18 are aligned on the surface of the element region 14 along outer edge of the rectangular element region 14. Distances between the circuit element connection pads 18 are aligned substantially equivalent to each other.

A plurality of external terminals 32, which are surrounded by the circuit element connection pads 18, are arranged on a central zone of a rectangular plane region which corresponds to the element region 14 of the semiconductor wafer 11. The central zone corresponds to an inside of the alignment of the circuit element connection pads 18 as viewed from the top surface of the semiconductor device 10.

The external terminals 32 are aligned at the same pitch.

Each of the external terminals 32 are electrically connected to each of the circuit element connection pads 18 by the fan-in interconnection structures 30.

Figure 1B:
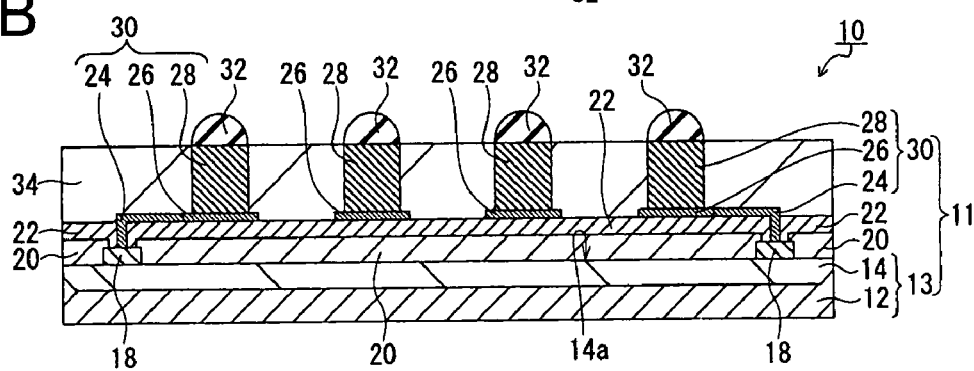
FIG. 1B illustrates a cross-sectional view of the semiconductor device taken along I-I' line of FIG. 1A.

As shown in FIG. 1B, a passivation film 20 is formed on the semiconductor body 13. An insulating film 22 is formed on the passivation film 20. Each of the plurality of circuit element connection pads 18 is partially exposed to the insulating film 22.

The insulating film 22 is formed so that each of the plurality of circuit element connection pads 18 is partially exposed therefrom. Each of the plurality of circuit element connection pads 18 is electrically connected to redistribution wiring layers 24.

Each of the interconnection structures 30 includes a columnar electrode 28 (post electrode) and the redistribution wiring layer 24. Each of the columnar electrodes 28 is electrically connected to each of the external terminals 32. Each of the redistribution wiring layers 24 electrically connects between the circuit element connection pad 18 and the columnar electrode 28. A part of the redistribution wiring layer 24 corresponds to a columnar electrode pad 26. Each of the columnar electrodes 28 is electrically connected to each of the columnar electrode pads 26.

The interconnection structures 30 are encapsulated by an encapsulation part 34 (an encapsulation resin material) so that the top surfaces of columnar electrodes 28 are exposed from the encapsulation part 34. The encapsulation part 34 is formed on the insulating film 22 on which the redistribution wiring layers 24 are formed.

The external terminals 32, which are, for example, solder balls, are formed on the top surfaces of the columnar electrodes 28.

Method of Manufacturing Semiconductor Device

A method of manufacturing a semiconductor device 10 is described with reference to FIGS. 1A and 1B will now be schematically described with reference to FIGS. 2A, 2B, 3A, 3B, and 3C.

A semiconductor device 10 of the present invention is manufactured by dicing a semiconductor substrate 12 into a plurality of semiconductor bodies, each of which corresponds to the semiconductor device 10. The semiconductor devices 10 are arranged in a matrix form.

First of all, a method for manufacturing a semiconductor device 10 will now be described with reference to FIGS. 2A and 2B with relation to a dicing step in which a semiconductor wafer 11 is separated into individual semiconductor devices 10.

Figure 2A:
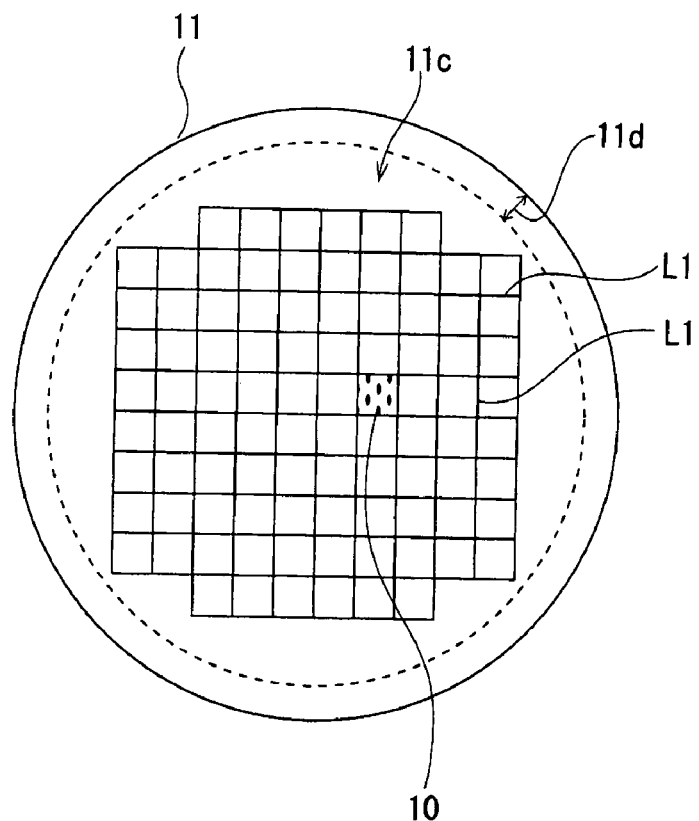
FIG. 2A illustrates a top view of a semiconductor wafer of the present invention.

FIG. 2A is a schematic top view showing a semiconductor wafer 11. The semiconductor wafer 11 shown in FIG. 2A is formed by a wafer processing and thus not individually diced into the plurality of semiconductor devices 10. FIG. 2B is a schematic enlarged top view showing the semiconductor wafer 11 of FIG. 2A for describing arrangement of the plurality of semiconductor devices 10 formed in the semiconductor wafer 11.

Figure 2B:
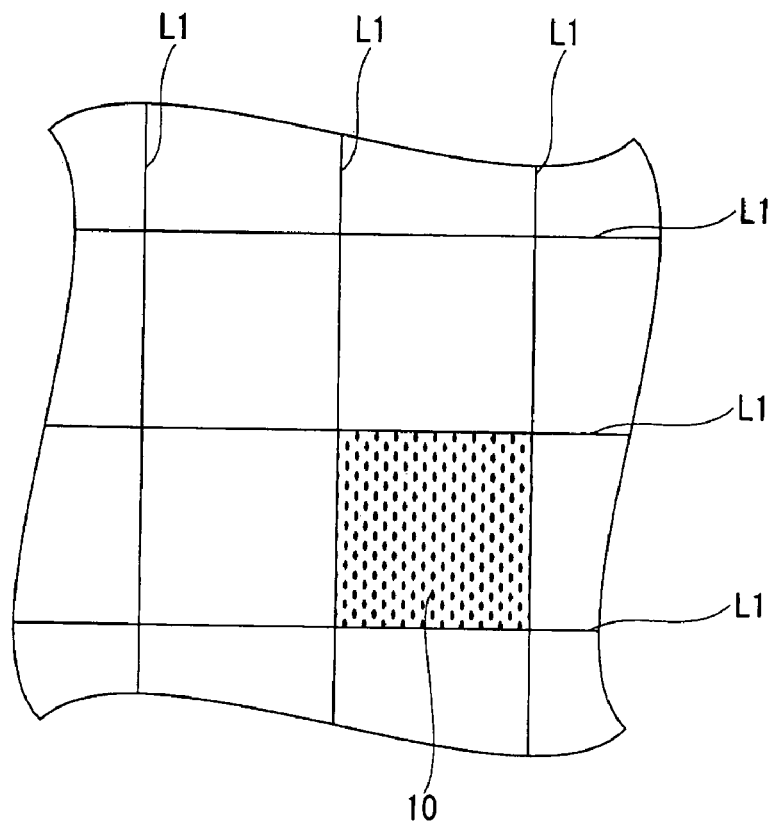
FIG. 2B illustrates a enlarged top view of the semiconductor wafer of FIG. 2A.

As shown in FIGS. 2A and 2B, a plurality of scribe lines L1 is formed in gridlike pattern on the semiconductor wafer 11. Each of the semiconductor devices 10 is formed as a rectangular area defined by these scribe lines L1.

An overall planar shape of the semiconductor wafer 11 is typically circular. A marginal region 11d, in which the plurality of semiconductor devices 10 are not formed, exists along the outer edge of the semiconductor wafer 11. A partial region of the semiconductor wafer 11, which is enclosed by the marginal region 11d, corresponds to a chip formation region 11c where the plurality of semiconductor devices 10 are formed.

One piece of the semiconductor devices 10, which is denoted by a dot pattern in FIG. 2A, is enlarged in FIG. 2B. The scribe lines L1 are also shown in FIG. 2B. Each of portions defined by the scribe lines L1 corresponds to one semiconductor device 10.

That is, the semiconductor wafer 11 is diced along the scribe lines L1 into individual semiconductor devices 10.

Next, a method of manufacturing a semiconductor device 10 is described with reference to FIGS. 3A, 3B, and 3C.

Figure 3A:
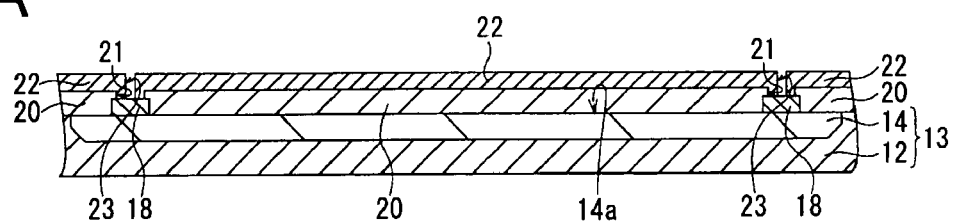
FIG. 3A illustrate a cross-sectional view of a semiconductor device in a beginning step of manufacturing.

FIG. 3A is a schematic cross-sectional view showing a semiconductor wafer 11 in a beginning step. FIG. 3B is a schematic cross-sectional view showing a semiconductor wafer 11 in a further step. FIG. 3C is a schematic cross-sectional view showing a semiconductor wafer 11 in a further step.

As shown in FIG. 3A, a semiconductor substrate 12 which is, for example, a silicon (Si) wafer is prepared. The semiconductor substrate 12 includes an element region 14 in which circuit elements including a plurality of active devices etc. are formed by a normal wafer processing.

Circuit element connection pads 18 are formed on a surface 14a of the element region 14. Each of the circuit element connection pads 18 is formed from either one of an alloyed material including Al (aluminum), an alloyed material including Au (gold), and an alloyed material including Cu (copper).

Next, a passivation film 20 is formed on the semiconductor substrate 12. The passivation film 20 is formed from, for example, a silicon nitride (SiN) film about 0.5 to 1.0 micrometers in thickness.

In the passivation film 20, apertures 21 are formed so that the circuit element connection pads 18 are partially exposed from the passivation film 20.

Next, an insulating film 22 is formed on the passivation film 20 by using a well-known spin coat method. The insulating film 22 is formed from an insulating material, for example, polyimide about ten micrometers in thickness. In the insulating film 22, apertures 23 are formed so that the circuit element connection pads 18 are partially exposed from the insulating film 22. The surface of insulating film 22 is substantially parallel to the surface 14a of the element region 14.

Figure 3B:
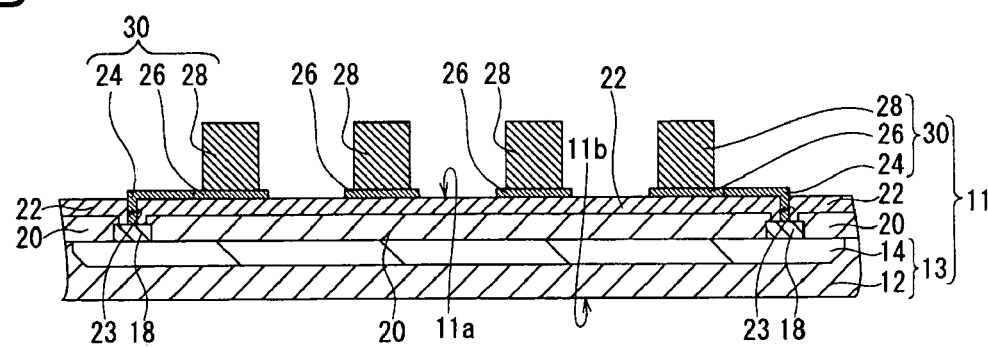
FIG. 3B illustrate a cross-sectional view of the semiconductor device in a further step of manufacturing.

Next, as shown in FIG. 3B, interconnection structures 30, which are connected to the circuit element connection pads 18 through the apertures 23, are formed on the insulating film 22. Then, the semiconductor wafer 11 shown in FIG. 3B is formed. As described, each of the interconnection structures 30 includes a columnar electrode pad 26.

When the interconnection structures 30 are formed, redistribution wiring layers 24 passing through the apertures 23 are formed on the insulating film 22. And then, columnar electrodes 28 are formed on the redistribution wiring layers 24.

The columnar electrodes 28 are formed by using a liftoff technique. For example, copper (Cu) is coated by means of a well-known photolithographic technique by using a conventional method while using a resist mask patterned. Then, the columnar electrodes 28 are formed by a process in which the resist mask is removed by a so-called lift-off technique.

It is preferable that the columnar electrodes 28 are formed vertically with respect to the surface of insulating film 22 and that transverse cross sections of the columnar electrodes 28 have a circler shape.

The semiconductor wafer 11, which has the semiconductor body 13, the passivation film 20, the circuit element connection pads 18, the insulating film 22, and the interconnection structures 30, is formed.

Figure 3C:
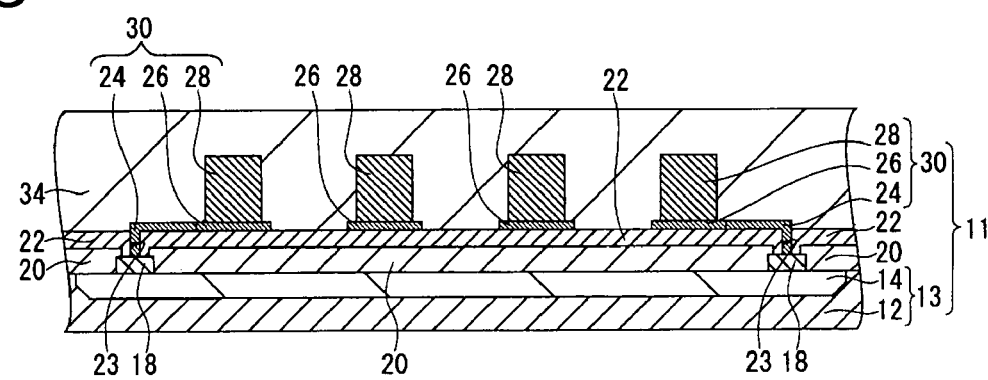
FIG. 3C illustrate a cross-sectional view of the semiconductor device in a further step of manufacturing.

Then, as shown in FIG. 3C, an encapsulating part 34 is formed on the semiconductor wafer 11 by using an encapsulation resin material, for example, an epoxy resin which is used for encapsulating the columnar electrodes 28 (the detail will be described later).

Next, the top surfaces of columnar electrodes 28 are exposed from the encapsulating part 34 in a grind step.

The semiconductor wafer 11, which are formed after completion of the above-described steps, is ground and diced along scribe lines L1 described above with reference to FIG. 2B. And then, the semiconductor wafer 11 is divided into individual semiconductor chips (the semiconductor devices 10).

Thus, the semiconductor devices 10, each of which has the structure described with reference to FIG. 1A, are manufactured from the one semiconductor wafer 11.

An encapsulation process of the present invention and configuration examples of a molding apparatus thereof or will now be described.

FIRST CONFIGURATION EXAMPLE OF METAL MOLD

A first configuration example of a metal mold (molding apparatus) used for a method of manufacturing a semiconductor device of the present invention is described with reference to FIGS. 4A, 4B, and 5.

Figure 4A:
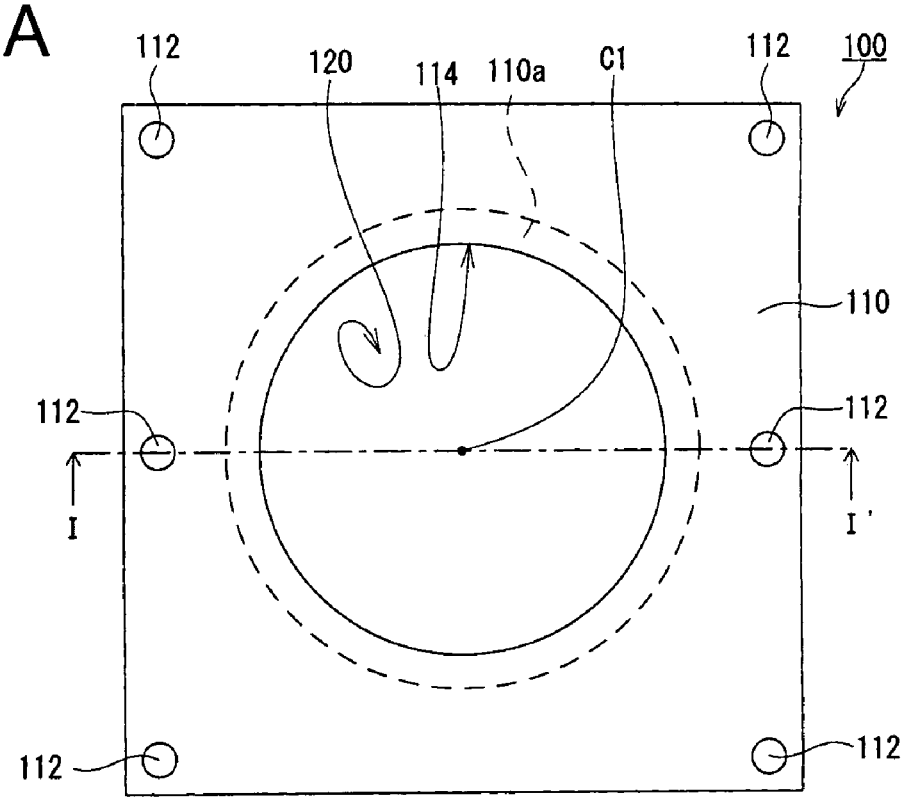
FIG. 4A illustrates a bottom view of a first metal mold part of a molding apparatus which is a first configuration example of mold apparatuses of the present invention.

FIG. 4A is a schematic bottom view of a first metal mold part of a first configuration example of the present invention. FIG. 4B is a schematic top view of a second metal mold part of the first configuration example.

Figure 4B:
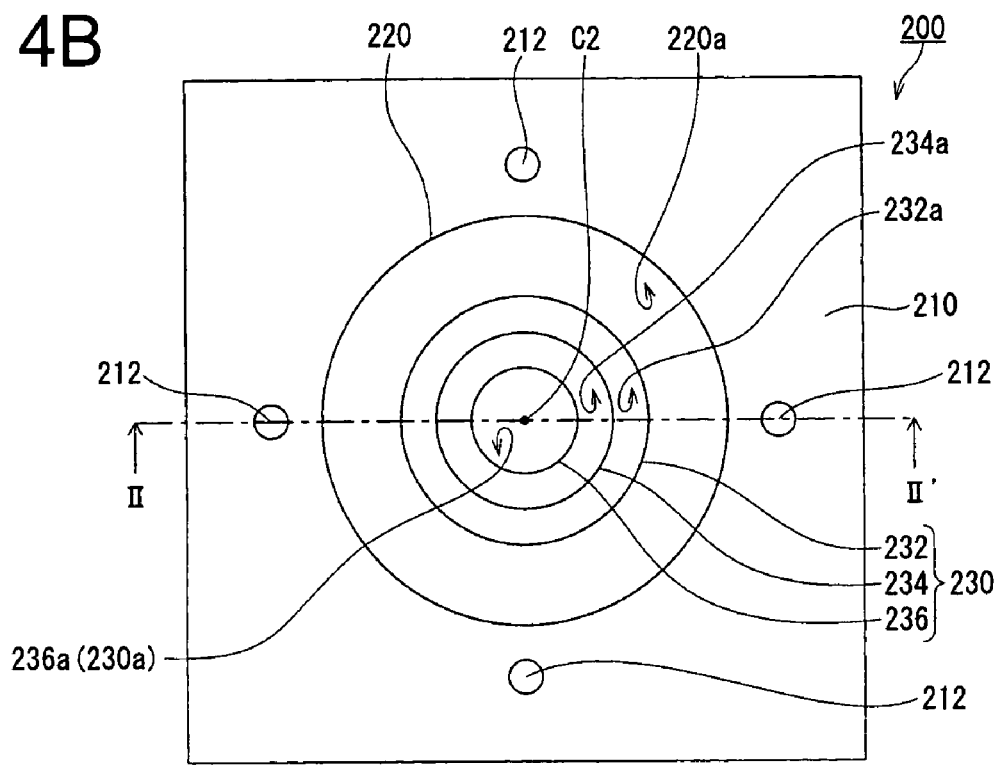
FIG. 4B illustrates a top view of a second mold the molding apparatus.
Figure 5:
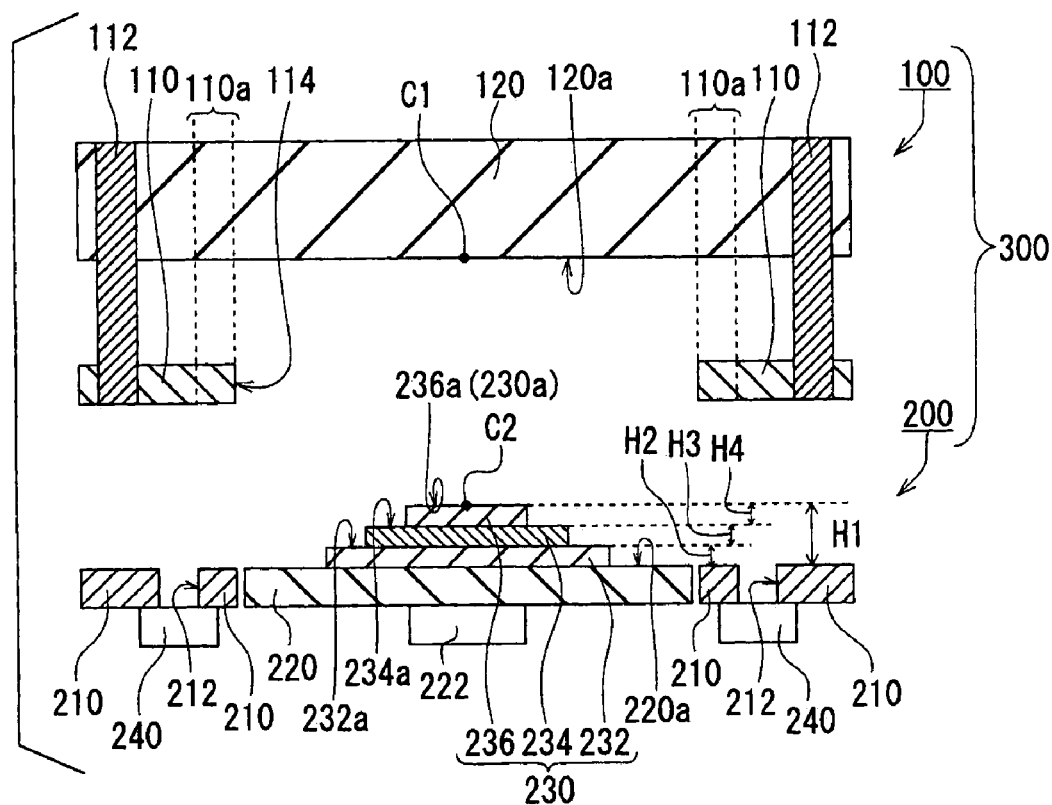
FIG. 5 illustrates a side view of the first metal mold part taken along I-I' dashed line of FIG. 4A and second metal mold part taken along II-II' dashed line of FIG. 4B.

FIG. 5 is a schematic cross-sectional view of a metal mold (molding apparatus) having the first metal mold part of FIG. 4A and the second metal mold part of FIG. 4B. The cross-sectional view of the first metal mold part in FIG. 5 is taken along I-I' dashed line of FIG. 4A. The cross-sectional view of the second metal mold part in FIG. 5 is taken along II-II' dashed line of FIG. 4B.

As shown in FIG. 5, a metal mold 300 has a first metal mold part 100 and a second metal mold part 200. The first metal mold part 100 is placed on the second metal mold part 200 so that the first metal mold part 100 and the second metal mold part 200 face each other.

A metal mold elevating system (not shown) for adjusting a relative distance between the first metal mold part 100 and the second metal mold part 200 is provided to either one of the first metal mold part 100 or the second metal mold part 200 or both of the first metal mold part 100 and the second metal mold part 200. By the metal mold elevating system(s), the first metal mold part 100 and the second metal mold part 200 are tightly coupled to each other so as to form a space (hereinafter "cavity") in which a vacuum is formed (the detail is described later). The metal mold elevating system(s) can elevate up and dawn either one of the first metal mold part 100 or the second metal mold part 200 or both of the first and second mental molds 100 and 200 while maintaining a vacuum in the cavity. The cavity is connected to a cavity air intake/exhaust means for forming a vacuum therein.

The first metal mold part 100 has a tabular first base part 120. A substrate contacting region 120a (hereafter "a substrate mounting surface") is formed on an undersurface of the first base part 120. The substrate mounting surface 120a has approximately a circular shape whose size and shape are dependent on a semiconductor wafer. Hereafter, a central point of the substrate mounting surface 120a is defined as "a first central point C1".

The first metal mold part 100 also has support arms 112 for fixing a semiconductor wafer. The support arms 112, which are separated from each other, maintain a space through which the semiconductor wafer can be entered. As shown in FIG. 4A, the support arms 112 are fixed into the first base part 120 so as to surround the semiconductor wafer along outer edge of the first base part 120. Six support arms 112, each of which penetrates into the first base part 120, are provided in the first configuration example of the present invention. Each of the support arms 112 is configured by functional parts such as an extensible hydraulic cylinder etc.

The first metal mold part 100 also has a clamp 110 which is fixed into the lower ends of support arms 112. The clamp 110 is firmly fixed into the lower end parts of support arms 112 inserted therein.

As shown in FIG. 4A, an aperture 114, whose shape is adjusted for a shape of a semiconductor wafer to be mounted thereon, is formed in the clamp 110. A region of the clamp 110, which surrounds a rim of the aperture 114 and has a ring shape of a predetermined width, is configured as a substrate supporting region 110a for mounting a semiconductor wafer.

Since the substrate supporting region 110a corresponds to a marginal region 11d of a semiconductor wafer 11 as shown in FIG. 2A, the aperture size and shape of the aperture 114 is dependent on a size and shape of a semiconductor wafer to be mounted, and thus the substrate supporting region 110a is also dependent on a size and shape of a semiconductor wafer.

The second metal mold part 200 includes a second base part 210 and a stage 220. The stage 220 faces to the aperture 114 of the clamp 110 of the first metal mold part 100. In other words, a surface 220a of the stage 220 of the second metal mold part 200 faces to the substrate mounting plate 120a of the first metal mold part 100. The stage 220 can be elevated up and down independent of the second base part 210.

The first configuration example of the metal mold is characterized by, in particular, the second metal mold part 200. The second metal mold part 200 has a second central point C2 facing to the first central point C1 of the substrate mounting plate 120a of the first metal mold part 100.

As shown in FIG. 5, the second metal mold part 200 has a projecting part 230 formed on the surface 220a of the stage 220. The projecting part 230 is a convex projecting to the first metal mold part 100. Either one of the top surface or the top of the projecting part 230 corresponds the second central point C2. The projecting part 230 has a plurality of stepped columnar parts.

The projecting part 230 of the first example has three columnar parts whose diameters are different from each other. That is, a first columnar part 232 has the maximum diameter among the three columnar parts, a second columnar part 234 has a diameter smaller than the first columnar part 232, and a third columnar part 236 having the smallest diameter. Each central point of the first column 232, the second column 234, and the third column 236 is adjusted to the second central point C2. The projecting part 230 is configured as a stepwise structure so that surface areas of columnar parts decrease in a direction toward the top columnar parts.

The apical surface of the projecting part 230 or the top of the projecting part 23 corresponds to a resin deposition region 230a on which an encapsulation resin material is mounted in an encapsulation step (the detail will be described later).

A height H1 between the surface 220a of the stage 220 and the resin disposition region 230a (the second central point C2), that is, the top (vertex or top surface) of projecting part 230, can be arbitrarily and suitably configured. The height H1 is preferably about 200 micrometers.

It is also more preferable that the number of the columnar parts of the projecting part 230 is larger. In this example, the projecting part 230 having three columnar parts whose the diameters are different from each other is described. The projecting part 230 may be configured by two or more columnar parts whose diameters are different from each other. The projecting part 230 is preferably configured in a stepped pattern (pyramidaly) by two to four columnar parts whose diameters are different from each other.

Heights H2, H3, and H4 of the first, second, and third columnar parts are preferably in the range of 50 μm-100 μm. The heights H2, H3, and H4 may be different from each other and may be substantially equivalent to each other.

The second base part 210 of the second metal mold part 200 has a plurality of air intake/exhaust holes 212. As shown in FIG. 4B, the air intake/exhaust holes 212 are formed in the second base part 210 so as to surround the stage 220. The air intake/exhaust holes 212 are coupled to an air intake/exhaust system 240 for adsorbing a release film (the detail will be described later). The release film is placed on the second base part 210 and the stage 220. The air intake/exhaust system 240 is configured by, for example, a vacuum pump and tubes connecting between the vacuum pump and the air intake/exhaust holes 212. Either one of the second base part 210 or the stage 220 may be formed from a porous material having porosity on micrometer scale. In the case, the air intake/exhaust system 240 is connected to either one of the second base part 210 or the stage 220, which is formed from the porous material. In addition, both of the second metal mold part 200 and the second base part 210 may be formed from a porous material. In this case, the air intake/exhaust system 240 is connected to both of the second metal mold part 200 and the second base part 210.

It is preferable that the stage 220 has a shape similar to the aperture 114 and also has a plane size smaller than that of the aperture 114.

The stage 220 has a stage elevating system 222 by which the stage is elevated up and dawn. The stage elevating system 222 is preferably composed by, for instance, a hydraulic cylinder and a servo motor, etc.

SECOND CONFIGURATION EXAMPLE OF METAL MOLD

A second configuration example of a metal mold of the present invention will now be described with reference to drawings. Since a first metal mold part of the second configuration example is similar to that of the first configuration example, a second metal mold part of the second configuration example is only described. Components similar to that of the first configuration example is denoted by the same numerals and are not further described.

Figure 6A:
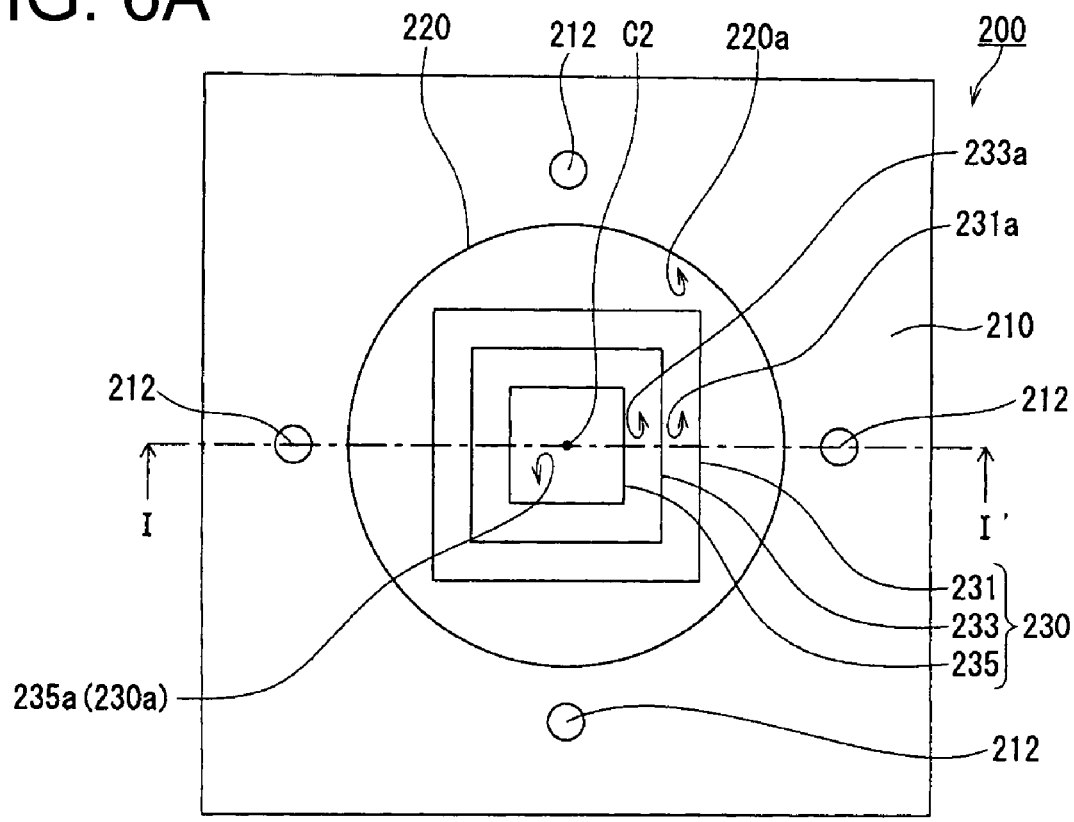
FIG. 6A illustrates a top view of a second mold of a molding apparatus which is a second configuration example of mold apparatuses of the present invention.
Figure 6B:
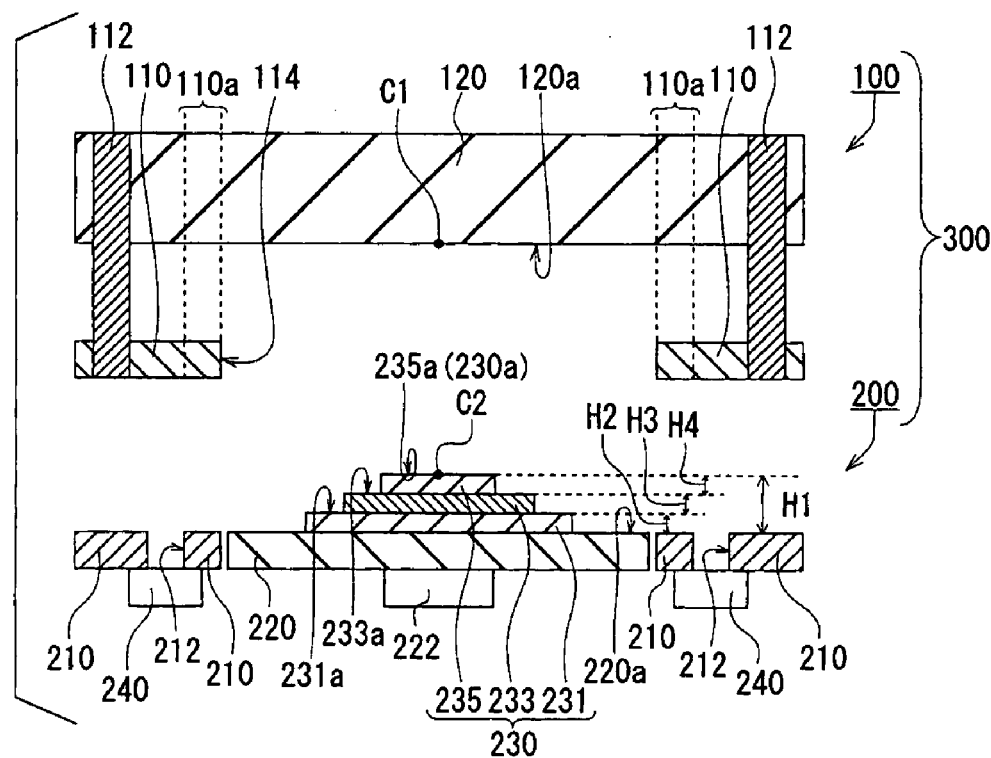
FIG. 6B illustrates a side view of the molding apparatus of the second example.

FIG. 6A is a schematic top view of a second metal mold part of a second configuration example of a metal mold of the present invention. FIG. 6B is a schematic cross-sectional view of the second configuration example having a first metal mold part of FIG. 4A and the second metal mold part of FIG. 6A. The cross-sectional view of the first metal mold part of FIG. 6B is taken along I-I' of FIG. 4A. The cross-sectional view of the second metal mold part of FIG. 6B is taken along I-I' of FIG. 6A.

As shown in FIG. 6B, a second metal mold part 200 has a stage 220 on which a projecting part 23 facing to a first metal mold part 100 is convexly formed. The projecting part 230 is configured by a plurality of rectangular column parts whose planar shapes are rectangular (square).

As shown in FIG. 6A, the projecting part 230 has three rectangular column parts which having planar shapes similar to each other. The surface areas of the surfaces of rectangular column parts facing to the first metal mold part 100 are different from each other. The projecting part 230 has a first rectangular column part 231 having the largest surface areas among three rectangular column parts, a second rectangular column part 233 having the surface areas smaller than the first rectangular column part 231, and a third rectangular column part 235 having the smallest surface areas. Center points of the first, second, and third rectangular column parts, 231, 233, and 235 substantially correspond to a second central point C2 which is a central point of the second metal mold part 200. The surface areas of the first, second, and third rectangular column parts, 231, 233, and 235 decrease in a direction toward the top of rectangular column part. The projecting part 230 is configured as a stepwise structure which the first, second, and third rectangular column parts, 231, 233, and 235 are formed on the stage 220.

In the second configuration example, a surface 235a of the third rectangular column part 235 corresponds to a resin disposition region 230a on which an encapsulation resin material is mounted in an encapsulating step (the detail will be described later).

A height H1 between the surface 220a of the stage 220 and the resin disposition region 230a which is a highest point (an apex or a top surface) of the projecting part 230 can be arbitrarily and suitably adjusted and preferably about 200 micrometers.

It is also more preferable that the number of rectangular column parts of the projecting part 230 is larger. In the second configuration example, the projecting part 230 having the three rectangular column parts whose surface areas are different from each other is described. The projecting part 230 may be configured by two or more rectangular column parts. The projecting part 230 is preferably configured in a stepped pattern (pyramidaly) by two to four rectangular column parts whose surface areas are different from each other.

Heights H2, H3, and H4 of the first, second, and third rectangular column parts are preferably in the range of 50 to 100 micrometers. The heights H2, H3, and H4 may be different from each other and may be substantially equivalent to each other.

THIRD CONFIGURATION EXAMPLE OF METAL MOLD

A third configuration example of a metal mold of the present invention will now be described in reference to drawings. Since a first metal mold part is similar to that of the first configuration example, a second metal mold part is only described. Components similar to that of the first configuration example are denoted by the same numerals and are not further described.

Figure 7A:
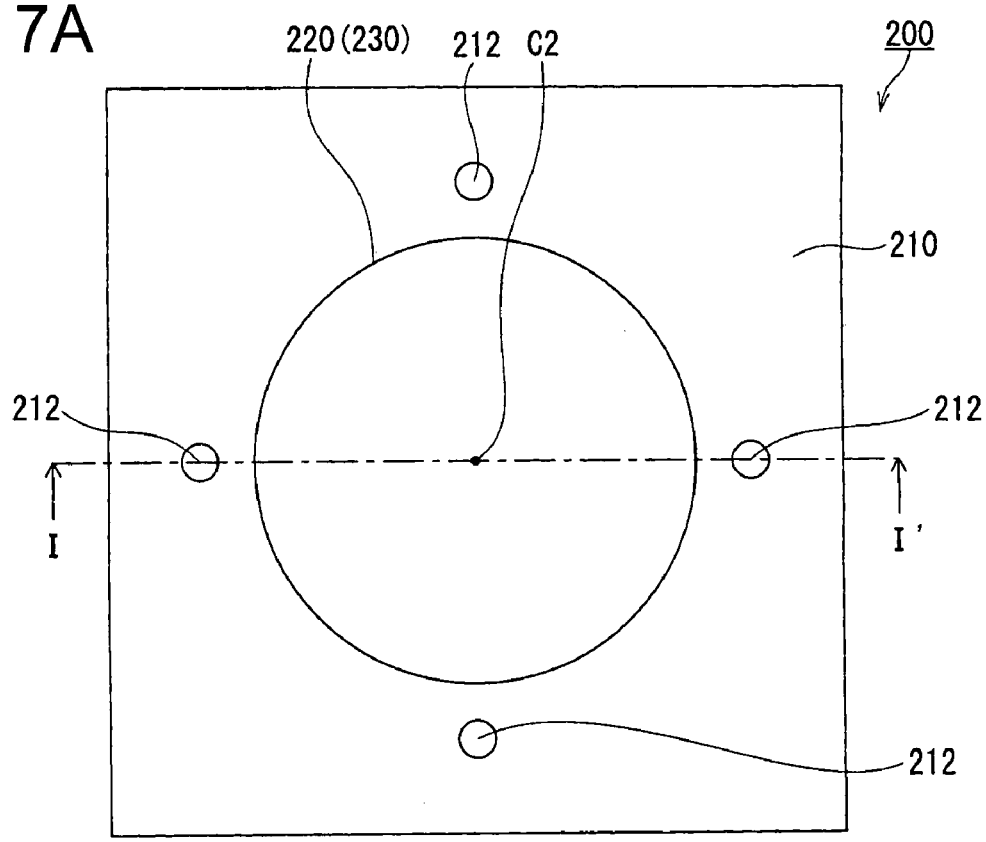
FIG. 7A illustrates a top view of a second mold of a molding apparatus which is a third example of mold apparatuses of the present invention.
Figure 7B:
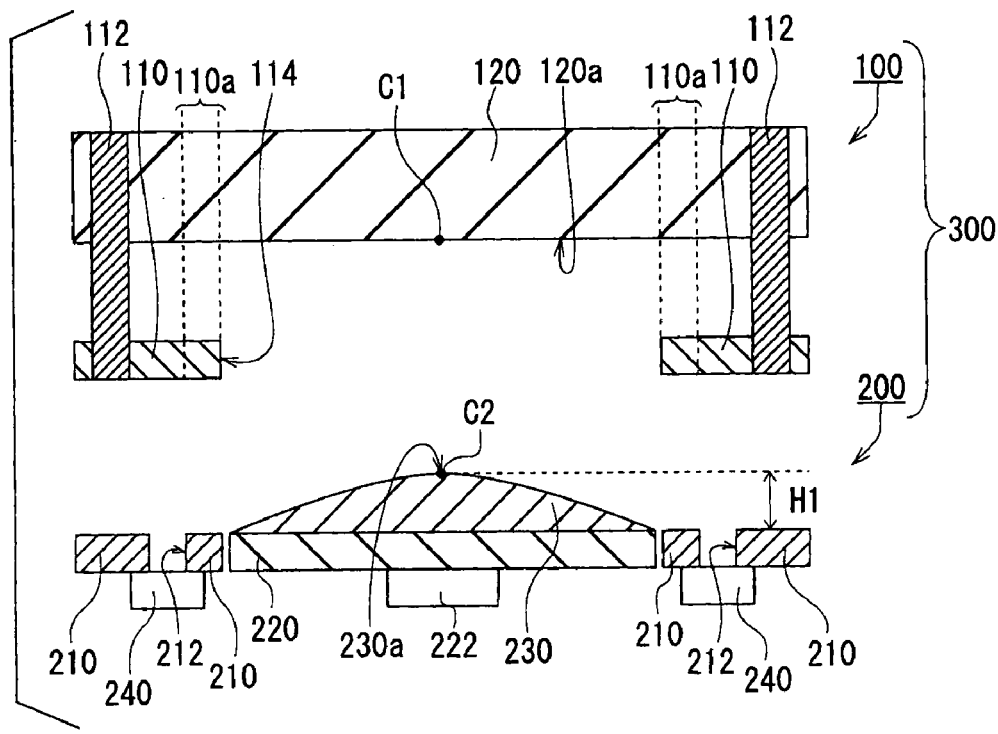
FIG. 7B illustrates a side view of the molding apparatus of the third example.

FIG. 7A is a schematic top view of a second metal mold part of a third configuration example of a metal mold of the present invention. FIG. 7B is a schematic cross-sectional view of the third configuration example having the first metal mold part of FIG. 4A and the second metal mold part of FIG. 7A. The cross-sectional view of the first metal mold part of FIG. 7B is taken along I-I' of FIG. 4A. The cross-sectional view of the second metal mold part of FIG. 7B is taken along I-I dashed line of FIG. 6A.

As shown in FIG. 7B, a second metal mold part 200 has a projecting part 230 which is a convex slope projecting and facing to a first metal mold part 100. The projecting part 230 has an apex (the highest point) thereof which corresponds to a second central point C2. The projecting part 230 also has an inclination which slops as approaching from the apex thereof to the edge of the second metal mold part 200. The projecting part 230 is configured by a upside-down saucer-shaped structure, that is, a rounded surface which is substantially spherical.

A partial region of the projecting part 230 corresponds to a resin disposition region 230a where an encapsulation resin material is disposed in an encapsulating step (the detail will be described later). The partial region of the projecting part 230 overlaps to the second central point C2 and It is configured that a planar shape of the resin disposition region 230a has an arbitrary and suitable shape.

A height H1 between a surface 220a of a stage 220 and the second central point C2 which corresponds to a peak (a highest point) of the projecting part 230 can be arbitrarily and suitably configured. The height H1 is preferably about 200 micrometers.

The projecting part 230 of the second metal mold part 200 may be shaped by grinding the stage 220 mechanically. The projecting part 230 of the second metal mold part 200 also may be shaped by grinding the stage 220 electrically with an electric discharge machining technique.

In addition, the projecting part 230 may be shapes by accumulating a plurality of thin plates (which correspond to the columnar parts and the rectangular column parts, as described above) on the stage 220. The thin plates have a circular or rectangular planar shape whose size is different from each other.

According to the metal mold (the first, second, and third configuration example) of the present invention, the projecting part 230 is formed on the stage 220 of the second metal mold part 200, so that a molding pressure is effectively applied on an encapsulation resin material mounted on the projecting part 230 in an encapsulating step. In the vicinity of the second central point C2 (top of the projecting part 230), a larger molding pressure is effectively applied on the encapsulation resin material. Therefore, the encapsulation resin material can be efficiently pervaded from the second center point C2 to the second base part 210, and thus air voids in the encapsulation resin material, which originate from air in a cavity can be efficiently prevented.

Encapsulating Step

An encapsulating step in which the above-described metal mold is used will now be described with reference to FIG. 8A, 8B, 9A and 9B. In the encapsulating step described here, a metal mold similar to the first configuration example is used for encapsulating with an encapsulation resin material.

Figure 8A:
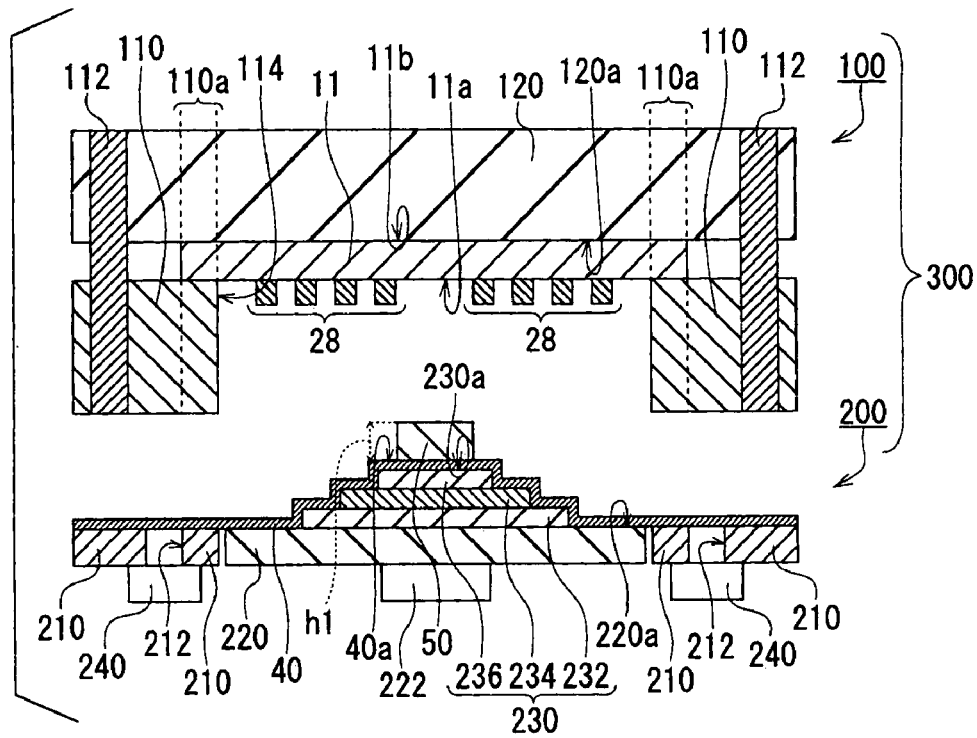
FIG. 8A illustrates a side view of a molding apparatus in a beginning step of resin-encapsulation.
Figure 8B:
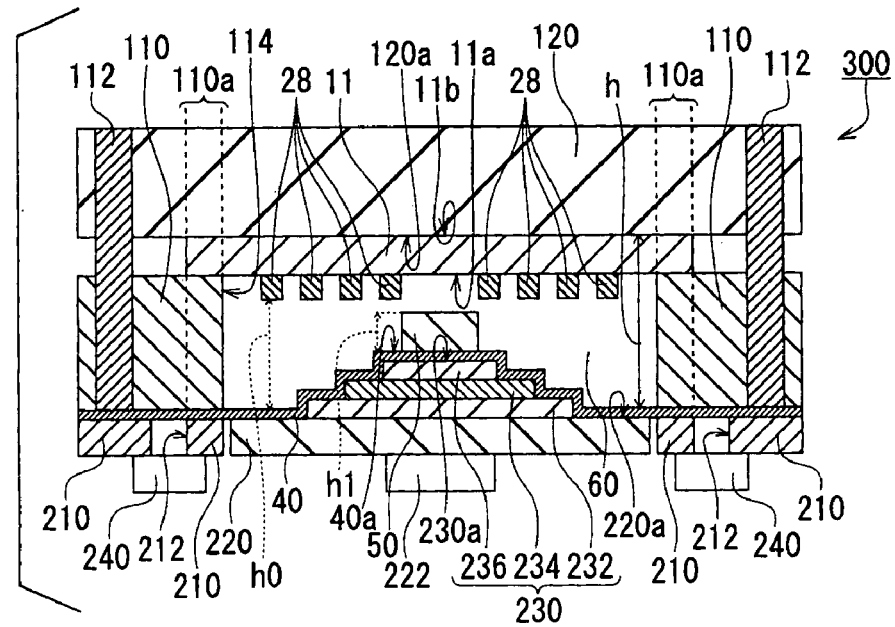
FIG. 8B illustrates a side view of the molding apparatus in a further step of resin-encapsulation.

FIG. 8A is a schematic cross-sectional side view of a metal mold having including a first metal mold part and a second metal mold part in a beginning step of encapsulation. FIG. 8B is a schematic cross-sectional side view of the metal mold in a further step of encapsulation.

Figure 9A:
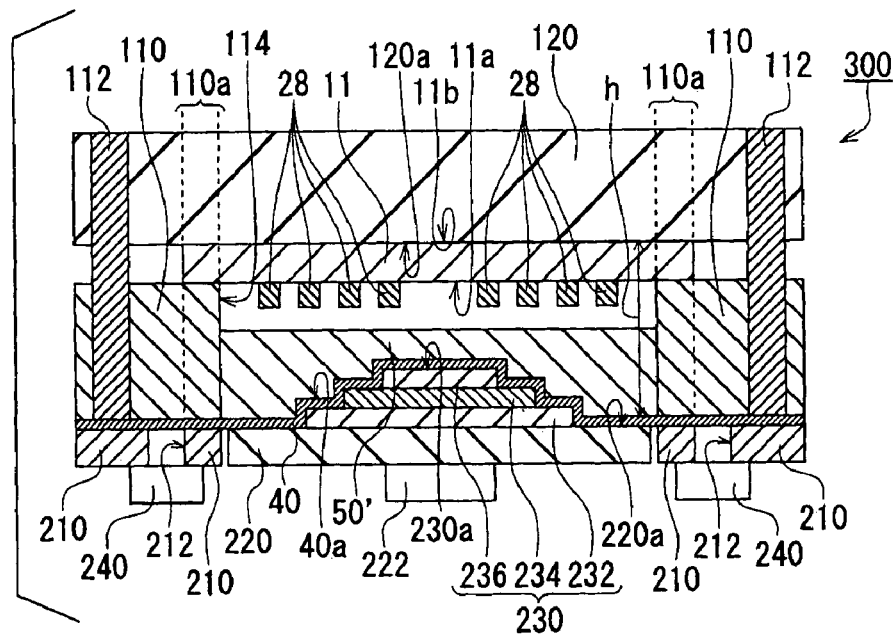
FIG. 9A illustrates a side view of the molding apparatus in a further step of resin-encapsulation.
Figure 9B:
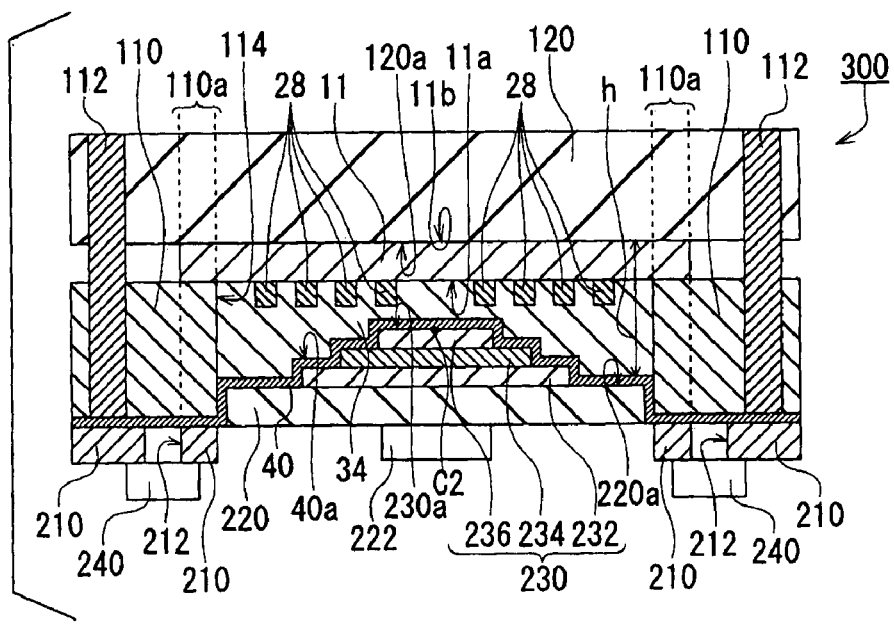
FIG. 9B illustrates a side view of the molding apparatus in a further step of resin-encapsulation.

FIG. 9A is a schematic cross-sectional side view of the metal mold in a further step of encapsulation. FIG. 9B is a schematic cross-sectional side view of the metal mold in a further step of encapsulation.

In the following description, a semiconductor wafer 11 is defined as a structural body in which a plurality of columnar electrodes 28 have been formed by a wafer processing as described in FIG. 3B.

In addition, an element region 14, circuit element connection pads 18, a passivation film 20, an insulating film 22, redistribution wiring layers 24, and columnar electrode pads 26, which are comprised by the semiconductor wafer 11, are not further described in the following description and are not shown in FIGS. 8A, 8B, 9A, and 9B for simplicity. A metal mold (molding apparatus) 300 is so arranged that a first metal mold part 100 is placed above or on a second metal mold part 200.

In addition, a surface of the insulating film 22 shown in FIG. 3B is defined as a first principal surface 11a of the semiconductor wafer 11. A surface opposed to the first principal surface 11a is defined as a second principal surface 11b of the semiconductor wafer 11. As shown in FIG. 2A, the semiconductor wafer 11 of FIG. 2A is configured by a plurality of structural body which are diced into a plurality of semiconductor devices 10. In the following description, the semiconductor wafer 11 is configured by two structural bodies corresponding to two semiconductor devices 10.

First of all, as shown in FIG. 8A, a semiconductor wafer 11, whose second principal surface 11b faces to a first base part 120 of a first metal mold part 100, is mounted on a substrate supporting region 110a of a clamp 110. At the same time, a marginal region 11d (shown in FIG. 2A) of the semiconductor wafer 11 is contacted to the substrate supporting region 110a. A plurality of columnar electrodes 28 are projected from an aperture 114 of the clamp 110 so as to face to the second metal mold part 200. That is, a first principal surface 11a of the semiconductor wafer 11, on which the columnar electrodes 28 are formed, is exposed through the aperture 114.

Next, the second principal surface 11b of the semiconductor wafer 11 is sustainably contacted to a substrate contacting region 120a of the first metal mold part 100 by shortening support arms 112 to which the clamp 110 is connected. The semiconductor wafer 11 may be continually attached to the substrate contacting region 120a by, for example, using an adsorption system (not shown). The adsorption system including through-holes is provided in the substrate contacting region 120a to which tubes and a vacuum pump are connected through the through-holes. The semiconductor wafer 11 may be sustainably attached by using both of adsorption system and the clamp 110.

Next, a release film 40 is attached on the second metal mold part 200, that is, on the second base part 210 and the stage 220.

A resin disposition region 40a, on which an encapsulation resin material is mounted in a later step, is configured on the release film 40. The resin disposition region 40a corresponds to a resin disposition region 230a of the second metal mold part 200.

The release film 40 is sustainably attached on the second metal mold part 200 by forming a vacuum with an air intake/exhaust system 240 connected to air intake/exhaust holes 212.

Next, as shown in FIG. 8B, the first metal mold part 100 and the second metal mold part 200 are combined so that a contour of the stage 220 of the second metal mold part 200 is within a contour of the aperture 114 of the first metal mold part 100.

Next, either one of the first metal mold part 100 or the second metal mold part 200 are heated by a conventional heating system (not shown). Both of the first and second metal mold parts, 100 and 200 may be heated by the heating system. The heating mechanism may be replaced by a heating/cooling system which can heat and cool.

Next, an encapsulation resin material 50, which is a tablet-shaped solid, is placed on the resin disposition region 40a of the release film 40. The encapsulation resin material 50 is not limited to a solid, and, for instance, a resin of a granular type may be available.

A commercial epoxy resin is favorably used for an encapsulation resin material 50. In typical, the epoxy resin has the highest fluidity at temperature in the range of 160 to 180° C. and can keep the high fluidity during a long time period. Accordingly, in the case that the epoxy resin is used as the encapsulation resin material 50, the metal mold are heated at temperature in the range of 160 to 180° C.

The amount of the encapsulation resin material 50 is dependent on a size of the semiconductor wafer 11 and a specification of the semiconductor devices 10, that is, a volume occupied by the encapsulation resin material.

In the case that a semiconductor wafer 11 having, for instance, eight inch diameters is encapsulated with an encapsulation resin material, the amount of the encapsulation resin material are determined in the following manner. Multiplying areas of the semiconductor wafer 11 by a height of the encapsulation resin material gives a volume (an effective volume of the encapsulation resin material). By subtracting a volume occupied by a plurality of columnar electrodes from the effective volume, a proper volume of the encapsulation resin material is derived. In typical, an encapsulation resin material thermally expands or contracts in its volume during a solidification processing. Therefore, the proper volume is estimated in consideration of the volume expansion or contraction of the resin in the solidification processing. In this way, an estimated proper volume of the encapsulation resin material is converted to a weight.

Next, an encapsulation resin material of a granulated type or a fine particle type, whose weight is predetermined, is shaped (compressed) as a tablet.

The tablet compression processing is described as follows. A conventional simple tableting machine can be used for the tablet compression processing, and thus components of the simple tableting machine is not described here.

First of all, an encapsulation resin material of, for example, a granulated type is enterer into a die having a predetermined shape. By following the above-described procedure, a weight of the encapsulation resin material is determined on the basis of a volume after the solidification processing. The encapsulation resin material of a granulated type is compressed so as to have a tablet-shape whose volume is in the range from 30% to 70% of a volume occupied by the encapsulation resin material of granulated type. The compressed encapsulation resin material 50 is preferably hard so as not to collapse even if it is carried by hand. Although a shape of the encapsulation resin material 50 is not especially limited, it is preferable that the encapsulation resin material 50 has a column shape because the encapsulation resin material 50 is required to melt and extend on the release film 40 in the same shape as the semiconductor wafer 11.

A plane size of the encapsulation resin material 50 is arbitrarily and suitably designed. A pressure applied on the encapsulation resin material 50 and a duration of the applied pressure can be arbitrarily and suitably controlled so that the encapsulation resin material 50 has a predetermined volume.

Next, while keeping the heating temperature, the first metal mold part 100 and the second metal mold part 200 are combined so that a contour of the stage 220 of the second metal mold part 200 is within a contour of the aperture 114 of the first metal mold part 100.

Next, as shown in FIG. 8B, the first metal mold part 100 and the second metal mold part 200 are tightly clamped by a metal mold elevating system (not shown). The clamping pressure under which the encapsulation resin material is not leaked to the outside of the clamped first and second metal molds is preferable. In specifically, the clamping pressure is in the range from 10 t (98000 N) to 60 t (588000 N). By combining the first metal mold part 100 and the second metal mold part 200, a cavity 60 is formed between the clamp 110 and the second base part 210.

A height h of the cavity 60 shown in FIG. 8B, to which the thickness of the semiconductor wafer 11 is added, is defined by the first and second metal mold parts, 100 and 200.

In addition, it is configured that a distance h0 between the top surface of the columnar electrodes 28 and the release film 40 is larger than the maximum thickness h1 of the encapsulation resin material 50. Or, it is configured that the maximum thickness h1 of the encapsulation resin material 50 is smaller than a distance h0 between the top surface of the columnar electrodes 28 and the release film 40.

Next, while keeping the first metal mold part 100 and the second metal mold part 200 at the predetermined heating temperature, air is removed from the cavity 60 by a cavity air intake/exhaust means (not shown) connected thereto. The ultimate vacuum is preferably 133.3 Pa (1 Torr) at a maximum in view of prevention of voids.

As shown in FIG. 9A, as a vacuum level in the cavity 60 increases, the encapsulation resin material 50 gradually melts and flows along the projecting part 230 to eventually cover the surface of the release film 40. A melted encapsulation resin material 50' which is completely melted is denoted in FIG. 9A in distinction from the encapsulation resin material 50.

Until the melted encapsulation resin material 50 starts to harden, the vacuum level in the cavity 60 is controlled so as to increase to a predetermined level.

In the case of using an epoxy resin as an encapsulation resin material 50, in view of voids generation (a length of time before melted encapsulation resin material 50' starts to solidify), it is suitable that the vacuum in the cavity 60 approaches to a predetermined level within five seconds after the encapsulation resin material 50 is mounted on the release film 40.

At the same time when the cavity 60 is depressurized, the stage 220 is gradually elevated up by operating a stage elevating system 222 until air (space) in the cavity 60 disappears. The air (space) in the cavity 60 can be also removed by lowering both of the first metal mold part 100 and the second metal mold part 200 while fixing the stage 220. Consequently, the melted encapsulation resin material 50' is contacted to the first principal surface 11a, and is attached thereto.

At this time, the molding pressure is largely applied on the encapsulation resin material 50 (the melted encapsulation resin material 50') around the second central point C2 (apex) of the projecting part 230. Accordingly, the encapsulation resin material 50 is radiated in all direction from the second central point C2 to the second base part 210 along the slope of projecting part 230. The cavity 60 can be spatially filled with the encapsulation resin material 50. The voids resulting from a residual air in the cavity 60 can be effectively prevented.

The vacuum level in the cavity 60 should be lowered to a predetermined level at which the voids in a resin encapsulated part are substantially prevented. It is preferably configured that the length of time before the vacuum level in the cavity 60 reaches to a predetermined level is shorter than that before air in the cavity 60 is completely disappeared by elevating the stage 220 or by lowering the first and second metal mold parts. In other words, it is preferably configured that a distance for elevating the stage 220 or for lowering the first metal mold part 100 and the second metal mold part 200 is shorter than a distance between the melted resin 50' and the first principal surface 11a.

In the case of using an epoxy resin as the encapsulation resin material 50, the melted resin 50' is further heated for solidification thereof. The solidification process of the melted resin 50' is arbitrarily and suitably performed depending on an encapsulation resin material. In the solidification process, the melted resin 50' is formed as a resin-encapsulated part of the semiconductor device.

According to the method for manufacturing (resin-encapsulating) the semiconductor device of the present invention, the encapsulation resin material 50 mounted on one part of the second metal mold part 200, that is, on the projecting part 230 is melted. At the same time, the encapsulation resin material 50. (the melted resin 50') is largely compressed by, in particular, the projecting part 230 which is formed in the center of the cavity 60. Thus, the encapsulation resin material 50 can easily extend over the cavity 60. The generation of voids in the resin-encapsulated part due to residual air in the cavity 60 can be prevented more effectively. In addition, according to the method of the present invention, the resin-encapsulated part can be formed in a short time period, at a high yielding rate, and with a high accuracy.

After the solidification process of the encapsulation resin material 50 (the melted resin 50') is completed, the first metal mold part 100 and the second metal mold part 200, which has been tightly combined with each other, are decoupled. The semiconductor wafer 11 is released from the first metal mold part 100 and the release film 40.

Next, excess of the encapsulation resin material is ground off in a grind step so that top surfaces of the columnar electrodes 28 are exposed. And then, external terminals are connected to the columnar electrodes 28.

By dicing the semiconductor wafer 11 in a dicing step, a plurality of semiconductor devices 10 are obtained.

EMBODIMENT

An embodiment of the method of the present invention described above (effect qualification test) will now be described with reference to FIGS. 10A and 10B.

Figure 10A:
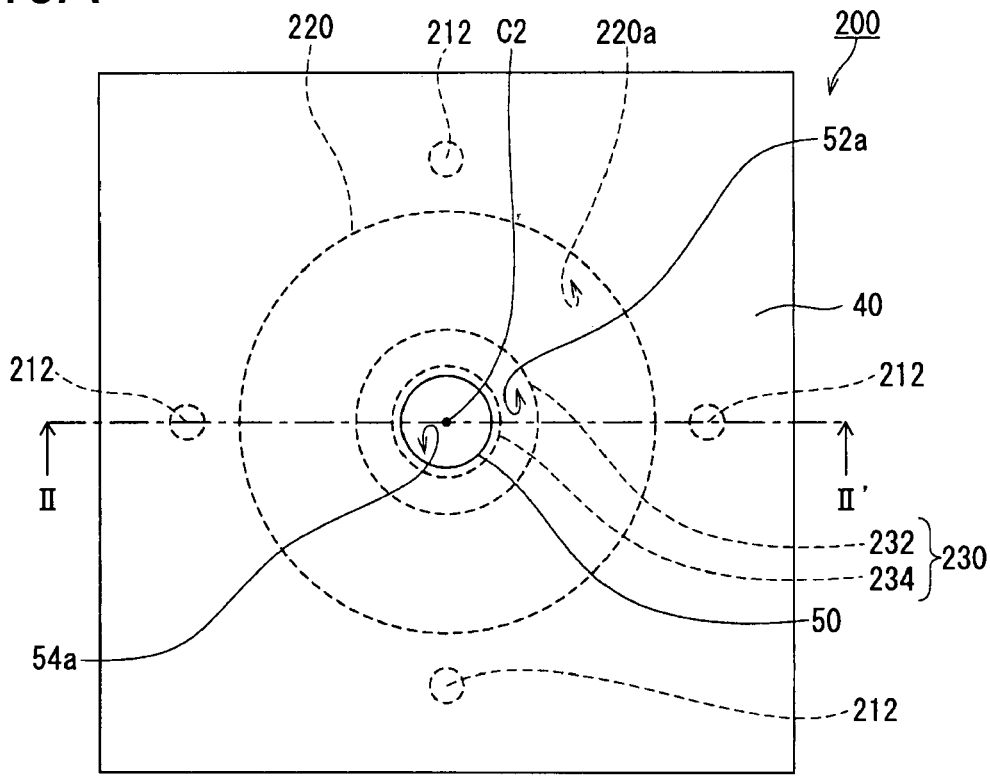
FIG. 10A illustrates a top view of a second mold of a molding apparatus which is a fourth example of mold apparatuses of the present invention.

FIG. 10A is a schematic top view of a second metal mold part of a first embodiment of the present invention.

Figure 10B:
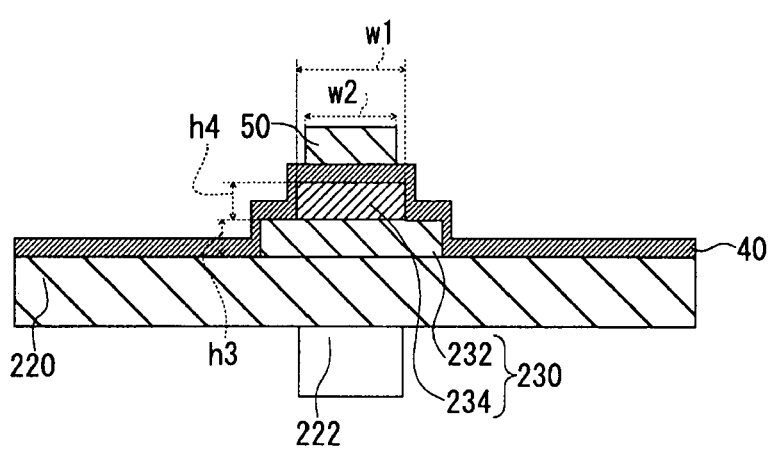
FIG. 10B illustrates a side view of the second mold of FIG. 10A.

FIG. 10B is a schematic cross-sectional side view of the second metal mold part taken along II-II' line of FIG. 10A.

A stage 220 of a second metal mold part 200 according to the example includes a projecting part 230 having a first column part 232 and a second column 234 whose diameter is smaller than that of the first column part 232.

The first column part 232 and the second column part 234 are formed from papers which are sheared in a circle. Since semiconductor devices are manufactured in a clean room, these column parts are formed from a dustless paper material, that is, a commercial clean paper.

A thickness h3 of the first column part 232 and a thickness h4 of the second column part 234 are substantially equivalent to each other.

The first column part 232 and the second column part 234 are formed on a stage 220 so that central points of the first column part 232 and the second column part 234 correspond to a central point C2 of the second metal mold part 200 and that the first column part 232 is formed on the second column part 234 having a larger diameter than the first column part 232.

A release film 40 is attached on bare surfaces of the first column part 232, the second column part 234, and the stage 220.

An encapsulation resin material 50 is placed on the release film 40.

Results will now be described with reference Table 1.

Table 1 shows relations between shapes of a second metal mold part 200 (a first column part 232 and a second column part 234) and void generation ratios (%) of semiconductor devices (the number of voids).

Semiconductor wafers having a diameter ($\phi$) of eight inches are encapsulated in the resin-encapsulating process. Column-shaped encapsulation resin materials 50 whose planar shapes are circle and thicknesses (height) are 10 mm are used for encapsulating the semiconductor wafers.

|  | THE NUMBER OF SAMPLES | THE NUMBER OF VOIDS | VOIDS GENERATION RATE (%) |
|---|---|---|---|
| PRIOR ART | 20102 | 156 | 0.78 |
| $\phi$140 mm (FIRST COLOMNAR PART) | 4370 | 17 | 0.39 |
| $\phi$100 mm (FIRST COLOMNAR PART) | 5244 | 24 | 0.46 |

-continued

|  | THE NUMBER OF SAMPLES | THE NUMBER OF VOIDS | VOIDS GENERATION RATE (%) |
|---|---|---|---|
| $\phi$140 mm (FIRST COLOMNAR PART) + $\phi$100 mm (SECOND COLOMNAR PART) | 4370 | 11 | 0.25 |

As shown in TABLE 1, in the case of configurations having a first column part ($\phi$ 140 mm or $\phi$ 100 mm) and having both of a first column part ($\phi$ 140 mm) and a second column part ($\phi$ 100 mm), void generation ratios can be reduced in comparison with the prior art. In particular, in the case of the configuration of both the first columnar part and the second columnar part, the void generation ratio is one third or less than the prior art.

In addition, in the case of the configuration having both of the first column part ($\phi$ 140 mm) and the second column part ($\phi$ 100 mm), the void generation ratio is reduced in comparison with the void generation ratio in the case of the configuration having the first column part ($\phi$ 140 mm) or the second column part ($\phi$ 100 mm).

CONFIGURATION EXAMPLE OF ENCAPSULATION RESIN MATERIAL

A configuration example of an encapsulation resin material, which is used for a method of encapsulation of the present invention, will now be described with reference to FIGS. 11A and 11B.

Figure 11A:
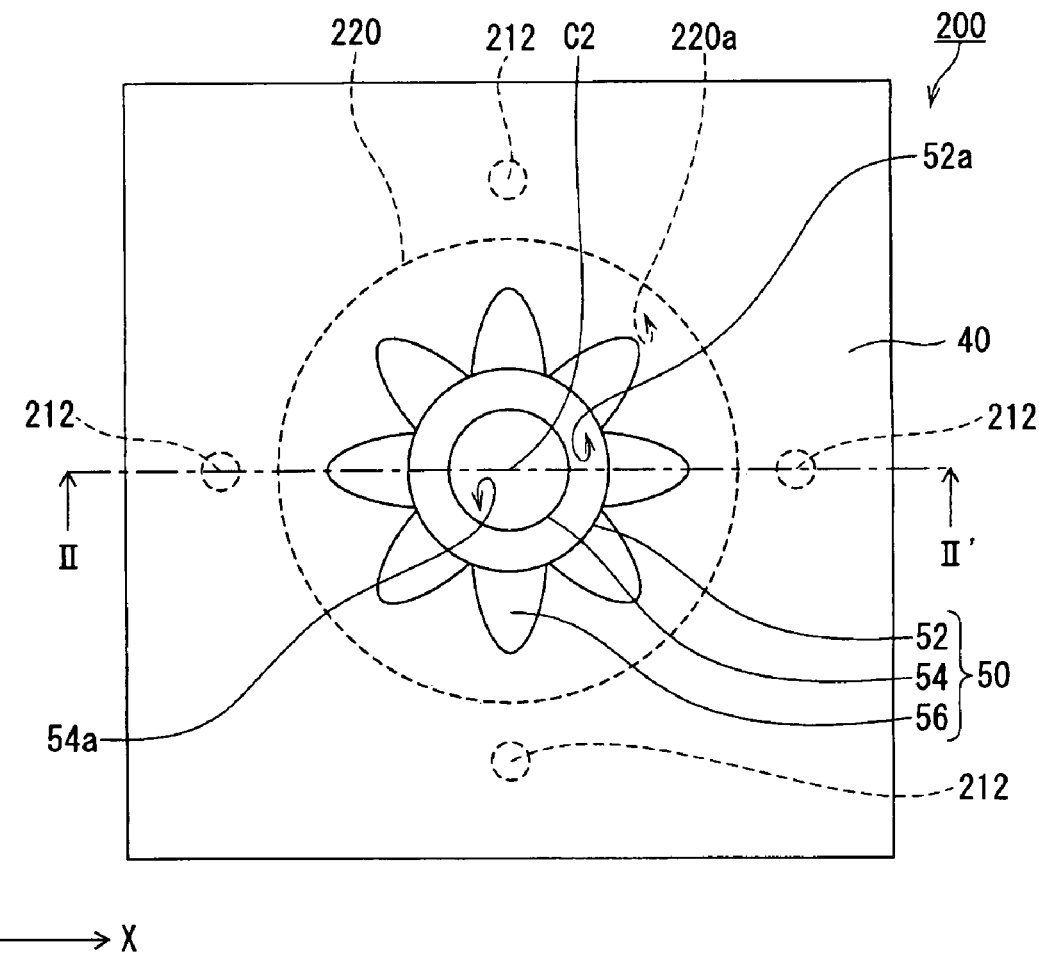
FIG. 11A illustrates a top view of an encapsulation resin material mounted on a second metal mold part of the present invention.
Figure 11B:
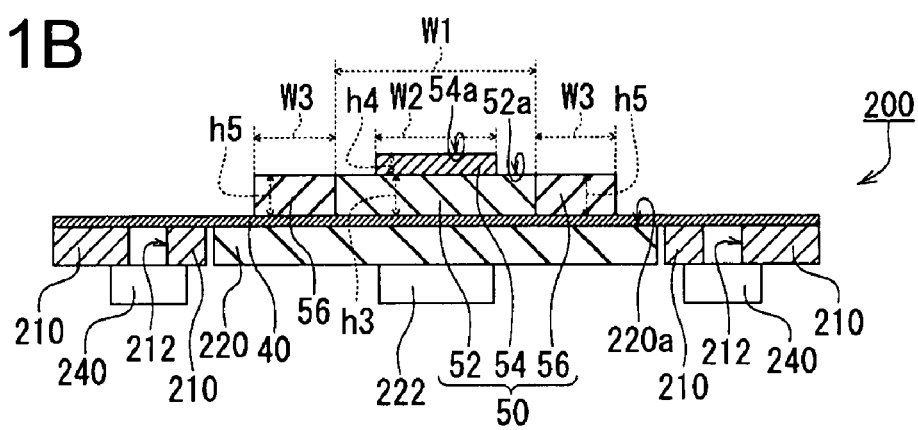
FIG. 11B illustrates a cross-sectional view of the encapsulation resin material taken along II-II' dashed line of FIG. 11A.

FIG. 11A illustrate a top view of an encapsulation resin material mounted on a second metal mold part. FIG. 11B illustrate a cross-sectional view of the encapsulation resin material taken along II-II' dashed line of FIG. 11A.

An encapsulation resin material 50 of the configuration example has a first columnar resin part 52, a second columnar resin part 54 having a diameter smaller than that of the first columnar resin part 52, and a plurality of radial resin parts 56.

The first columnar resin part 52 and the second columnar resin part 54 are mounted on a resin disposition region of a release film 40.

As shown in FIG. 11A, central points of the first columnar resin part 52 and the second columnar resin part 54 correspond a central point C2 of the second metal mold part 200. The second columnar resin part 54 is mounted on the first columnar resin part 52 having a diameter larger than that of the second columnar resin part 54.

In addition to the first columnar resin part 52 and the second columnar resin part 54, the encapsulation resin material 50 includes the plurality of radial resin parts 56 which are radially disposed so as to surround the first columnar resin part 52.

It is suitable that the each of the radial resin parts 56 has the same thickness as the first columnar resin part 52 and the second columnar resin part 54. Shapes of the radial resin parts 56 may be arbitrarily and suitably designed. The radial resin parts 56 whose planar shapes are, for example, a rectangle or an ellipse may be designed. Each of the radial resin parts 56 of the example has a planar shape that a bamboo grass having the major axis that extends straight to the sin. It is preferable that each long axis of the radial resin parts 56 has same length.

The number of the radial resin parts 56 can be arbitrarily and suitably configured. The encapsulation resin material 50 of the configuration example has eight radial resin parts 56. Eight radial resin parts 56 are roundly disposed at regular intervals so that consecutive angles between the long axis adjacent to each other is 450. As shown in FIG. 11A, each of the radial resin parts 56 is mounted on the release film 40 so as to contact the first columnar resin part 52. Each of the radial resin parts 56 may be separated from the first columnar resin part 52.

The first columnar resin part 52, the second columnar resin part 54, and the radial resin parts 56 are individually formed by a simple tableting machine, and then they are mounted on the release film 40.

As described above, if the plurality of resin parts are molded and then the encapsulation process is performed, the melted resin material can be extended more effectively and more rapidly form the center of cavity to the edge of cavity, in other words, from the center of semiconductor substrate to the outside edge of semiconductor substrate. Therefore, the generation of air voids in the encapsulation part, which is resulted from the residual, air in the cavity, can be prevented more effectively. In addition, the resin encapsulated part can be fabricated in a short period of time, at a yield ratio, and with a high accuracy.

The encapsulation resin material 50 having the plurality of resin parts according to the embodiment can be used in the encapsulating process in which the second metal mold part is used. Voids generating in the encapsulating process can be prevented more effectively.

This application is based on Japanese Patent Application No. 2006-142991 which is herein incorporated by reference.

What is claimed is:

1. A molding apparatus, comprising:
   an upper half having a substrate mounting plate; and
   a lower half having a bottom surface and being coupled with the upper half to form a cavity there between so that the substrate mounting plate and the bottom surface face the cavity, the lower half including a projecting part having a top surface which faces the cavity and which projects from the bottom surface toward a substantial center point of the substrate mounting plate, the projecting part being configured by a plurality of column parts which are piled up together to form step surfaces facing the cavity so that a higher step surface has an area that is narrower than that of a lower step surface,
   wherein the substrate mounting plate is adjustably mounted on the upper half and movable toward the lower half, and
   wherein the upper half includes a clamp mounted thereon which surrounds the projecting part when the upper and lower halves are coupled with each other.

2. The molding apparatus according to claim 1, wherein each of the plurality of circular column parts is circular.

3. The molding apparatus according to claim 1, each of the plurality of column parts is rectangular.

4. A molding apparatus, comprising:
   an upper half having a substrate mounting plate; and
   a lower half having a bottom surface and being coupled with the upper half to form a cavity there between so that the substrate mounting plate faces the cavity, the lower half including a projecting part having a substantially spherical surface which faces the cavity and which projects from the bottom surface, and having an apex which corresponds to a substantial center point of the substrate mounting plate,
   wherein the substrate mounting plate is adjustably mounted on the upper half and movable toward the lower half, and
   wherein the upper half includes a clamp mounted thereon which surrounds the projecting part when said upper and lower halves are coupled with each other.

* * * * *